US010665402B2

(12) United States Patent
Sommerer et al.

(10) Patent No.: US 10,665,402 B2
(45) Date of Patent: May 26, 2020

(54) HIGH VOLTAGE, CROSS-FIELD, GAS SWITCH AND METHOD OF OPERATION

(71) Applicant: General Electric Company, Schenectady, NY (US)

(72) Inventors: Timothy John Sommerer, Ballston Spa, NY (US); Joseph Darryl Michael, Delmar, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/891,539

(22) Filed: Feb. 8, 2018

(65) Prior Publication Data

US 2019/0244775 A1 Aug. 8, 2019

(51) Int. Cl.
*H01H 33/02* (2006.01)
*H01H 33/53* (2006.01)
(Continued)

(52) U.S. Cl.
CPC .......... *H01H 33/025* (2013.01); *H01H 33/53* (2013.01); *H01J 17/06* (2013.01); *H01J 17/10* (2013.01)

(58) Field of Classification Search
CPC .... H01H 33/025; H01H 33/122; H01H 33/53; H01H 33/56; H01H 33/565;
(Continued)

(56) References Cited

U.S. PATENT DOCUMENTS

| | | | |
|---|---|---|---|
| 3,638,061 | A | 1/1972 | Lutz et al. |
| 4,596,945 | A | 6/1986 | Schumacher et al. |

(Continued)

FOREIGN PATENT DOCUMENTS

| | | | |
|---|---|---|---|
| CN | 102176401 | B | 4/2013 |
| JP | 2012224886 | A | 3/2015 |
| WO | 2014142974 | A1 | 9/2014 |

OTHER PUBLICATIONS

Goebel, D., "High Power Modulator for Plasma Ion Implantation", Journal of Vacuum Science & Technology B, Nanotechnology and Microelectronics: Materials, Processing, Measurement, and Phenomena, http://avs.scitation.org/doi/abs/10.1116/1.587356, vol. 12, Issue 02, Jun. 1998.

(Continued)

*Primary Examiner* — William A Bolton
(74) *Attorney, Agent, or Firm* — Armstrong Teasdale LLP

(57) ABSTRACT

A high voltage gas switch includes a gas-tight housing containing an ionizable gas at a preselected gas pressure. The gas switch includes a gas-tight housing containing an ionizable gas at a gas pressure selected based upon a Paschen curve for the ionizable gas, where the Paschen curve plots breakdown voltages of the ionizable gas as a function of gas pressure multiplied by grid-to-anode distance, and where values of gas pressure multiplied by grid-to-anode distance increase over at least a portion of the Paschen curve in conjunction with increasing breakdown voltages. The gas switch also includes an anode disposed within the gas-tight housing, a cathode disposed within the gas-tight housing, and a control grid positioned between the anode and the cathode, where the control grid is spaced apart from the anode by a grid-to-anode distance selected based upon a desired operating voltage.

18 Claims, 4 Drawing Sheets

(51) Int. Cl.
*H01J 17/10* (2006.01)
*H01J 17/06* (2006.01)

(58) Field of Classification Search
CPC .... H01H 2033/566; H01J 13/08; H01J 13/28; H01J 13/20; H01J 13/02; H01J 13/52; H01J 17/48; H01J 7/24; H01J 17/00; H02M 7/006; H02M 7/12
USPC ......... 218/74, 68, 107, 123; 315/41, 111.41; 204/164
See application file for complete search history.

(56) References Cited

U.S. PATENT DOCUMENTS

| | | | | |
|---|---|---|---|---|
| H878 | H * | 1/1991 | Petr | H01J 17/48 313/58.9 |
| 5,008,798 | A | 4/1991 | Harvey et al. | |
| 5,014,289 | A * | 5/1991 | Rothe | H01J 35/04 378/119 |
| 5,019,752 | A | 5/1991 | Schumacher | |
| 5,075,594 | A | 12/1991 | Schumacher et al. | |
| 5,132,597 | A | 7/1992 | Goebel et al. | |
| 5,329,205 | A | 7/1994 | Goebel et al. | |
| 5,477,106 | A * | 12/1995 | Lednum | H01J 17/30 313/589 |
| 5,568,019 | A | 10/1996 | Mason et al. | |
| 5,631,524 | A | 5/1997 | Matsuzaki et al. | |
| 5,828,176 | A | 10/1998 | Goebel | |
| 6,433,480 | B1 | 8/2002 | Stark et al. | |
| 6,787,010 | B2 | 9/2004 | Cuomo et al. | |
| 7,825,595 | B2 | 11/2010 | Bochkov et al. | |
| 8,685,213 | B2 | 4/2014 | Kouznetsov et al. | |
| 9,294,085 | B1 * | 3/2016 | Gruner | H03K 17/52 |
| 9,520,801 | B1 | 12/2016 | She et al. | |
| 2015/0098259 | A1 | 4/2015 | Michael et al. | |
| 2016/0020057 | A1 | 1/2016 | Sommerer et al. | |

OTHER PUBLICATIONS

An-Jen et al., "Nano-ZnO Cold Cathodes for Controlling Plasma Switches", Nanotechnology, http://ieeexplore.ieee.org/document/1500809/, Sep. 6, 2005.

Li et al., "Finite element modeling of plasma initiation by carbon nanotubes (CNTs) as cold cathode in pseudospark switch Sign In or Purchase", Power Modulator and High Voltage Conference, http://ieeexplore.ieee.org/document/7287278/, Oct. 5, 2015.

Schonhuber, Max J. "Breakdown of gases below Paschen minimum: basic design data of high-voltage equipment." IEEE Transactions on Power apparatus and Systems 2 (1969): 100-107.

Goebel, Dan M. "Cold-cathode, pulsed-power plasma discharge switch." Review of scientific instruments 67, No. 9 (1996): 3136-3148.

Goebel, D.M. et al., "Low voltage drop plasma switch for inverter and modulator applications." Review of scientific instruments 64, No. 8 (1993): 2312-2319.

Guseva, L. G. "On discharge striking in polyatomic gases at pd<(pd) min." In Investigations into Electrical Discharges in Gases, pp. 1-11. 1964.

Goerz, D.A. et al.,"A low-profile high-voltage compact gas switch." In Pulsed Power Conference, 1997. Digest of Technical Papers. 1997 11th IEEE International, vol. 1, pp. 328-333. IEEE, 1997.

* cited by examiner

HIGH VOLTAGE, CROSS-FIELD, GAS SWITCH AND METHOD OF OPERATION

STATEMENT REGARDING FEDERALLY SPONSORED RESEARCH AND DEVELOPMENT

This invention was made with Government support under contract number DE-AR0000298 awarded by the Department of Energy Advanced Research Projects Agency-Energy. The Government has certain rights in this invention.

BACKGROUND

The field of disclosure relates generally to a high voltage, cross-field, gas switch and, more particularly, to a cross-field gas switch capable of operation at high voltage based upon selection of a grid-to-anode distance and gas pressure within the switch.

Cross-field gas switches, such as planar cross-field gas switches, are known. Conventionally, these switches include an electrode assembly, such as a cathode spaced apart from an anode, enclosed by a gas-tight chamber. The gas-tight chamber is filled with an ionizable gas, and a voltage is applied to a control grid disposed between the anode and cathode to initiate a plasma path therebetween. The switch is operable, in the presence of an input voltage applied to the anode, to conduct a large electrical current between the anode and the cathode. The plasma conduction path may be terminated by reverse biasing the control grid, such that the electrical current flowing from the anode to the cathode is transiently drawn off by the control grid (and accompanying circuitry), so that the gas once again becomes insulating. Thus, the device functions as a gas filled switch, or "gas switch" in the presence of an input voltage and a conducting plasma.

Drawbacks associated with at least some known gas switches include operational ceilings around 160 kilovolts (kV). Specifically, many common gas switches are not designed for operation above 160 kV and tend not to be feasible for large-scale, long-term, implementation in high voltage power systems, such as, for example, electrical distribution systems operating in the range of hundreds of kilovolts.

BRIEF DESCRIPTION

In one aspect, a high voltage gas switch is provided. The gas switch includes a gas-tight housing containing an ionizable gas at a gas pressure selected based upon a Paschen curve for the ionizable gas, where the Paschen curve plots breakdown voltages of the ionizable gas as a function of gas pressure multiplied by grid-to-anode distance, and where values of gas pressure multiplied by grid-to-anode distance decrease over at least a portion of the Paschen curve in conjunction with increasing breakdown voltages. The gas switch also includes an anode disposed within the gas-tight housing, a cathode disposed within the gas-tight housing, and a control grid positioned between the anode and the cathode, where the control grid is spaced apart from the anode by a grid-to-anode distance selected based upon a desired operating voltage.

In another aspect, a high voltage, cross-field, gas switch is provided. The gas switch contains an ionizable gas at a preselected gas pressure. The preselected gas pressure is selected based on a distance between electrodes of the gas switch, and a Paschen curve for the ionizable gas, wherein the Paschen curve plots breakdown voltages of the ionizable gas as a function distance between electrodes multiplied by gas pressure, and values of distance between electrodes multiplied by gas pressure decrease over a portion of the Paschen curve in conjunction with increasing breakdown voltages.

In yet another aspect, a high voltage gas switch is provided. The gas switch includes a gas-tight housing containing an ionizable gas at a gas pressure in the range of 0.01-1.0 torr, where the gas pressure is selected based upon a Paschen curve for the ionizable gas. The gas switch also includes an anode disposed within the gas-tight housing, a cathode disposed within the gas-tight housing, and a control grid positioned between the anode and the cathode, where the control grid is spaced apart from the anode by a grid-to-anode distance in the range of 2.0-15.0 centimeters (cm), and where the grid-to-anode distance is selected based upon a desired operating voltage.

DRAWINGS

These and other features, aspects, and advantages of the present disclosure will become better understood when the following detailed description is read with reference to the accompanying drawings in which like characters represent like parts throughout the drawings, wherein.

Figure 1:
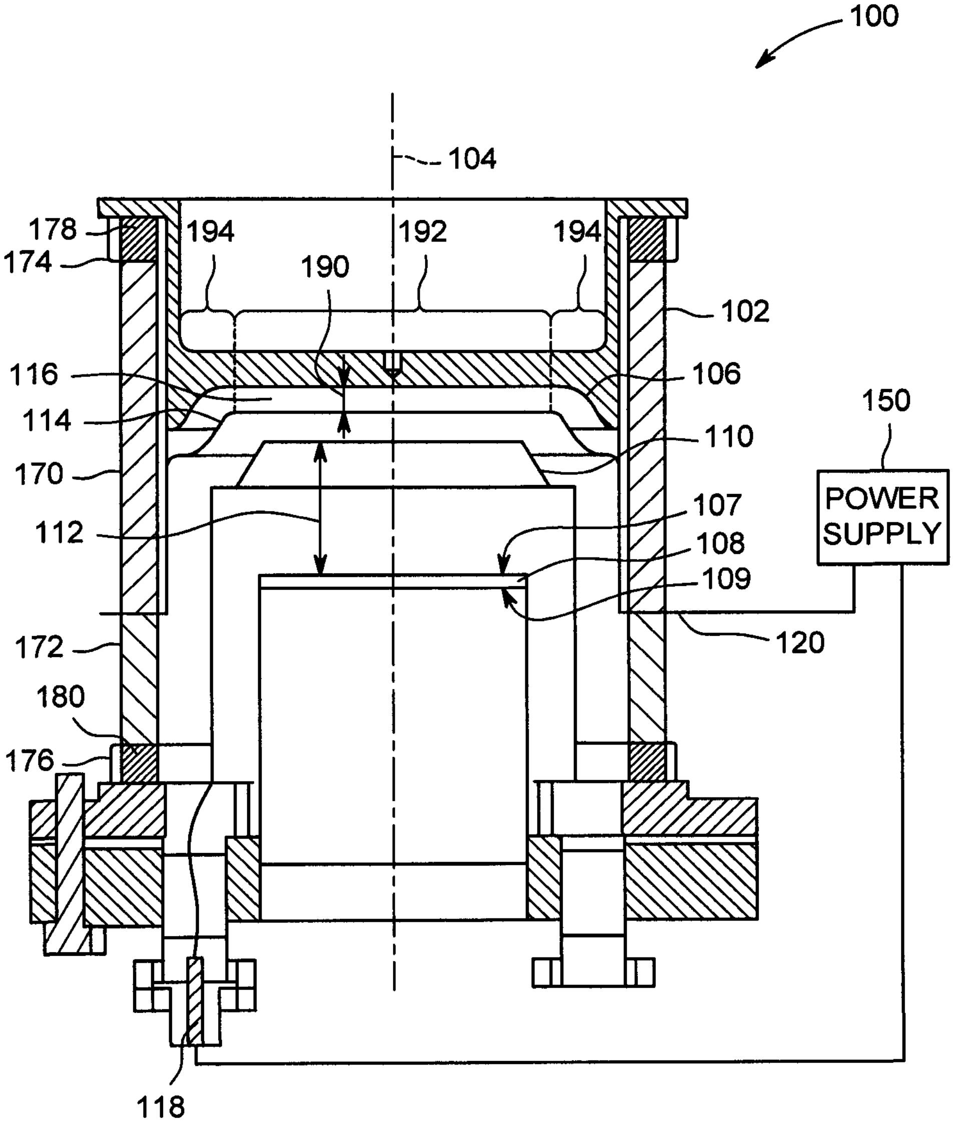
FIG. 1 is a cross-sectional view of an exemplary high voltage, cross-field, gas switch.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise.

As used herein, spatially relative terms, such as "beneath," "below," "under," "lower," "higher," "above," "over," and the like, may be used to describe one element or feature's relationship to one or more other elements or features as illustrated in the figures. It will be understood that such spatially relative terms are intended to encompass different orientations of the elements and features described herein both in operation as well as in addition to the orientations depicted in the figures. For example, if an element or feature in the figures is turned over, elements described as being "below" one or more other elements or features may be regarded as being "above" those elements or features. Thus, exemplary terms such as "below," "under," or "beneath" may encompass both an orientation of above and below, depending, for example, upon a relative orientation between such elements or features and one or more other elements or features.

As used herein, "vacuum breakdown" refers to a condition within a gas switch, in which electrons are emitted from a surface of a negative electrode, such as a cathode and/or control grid, of the gas switch under the influence of an electrostatic field generated by a positive electrode, such as an anode, of the gas switch. Specifically, vacuum breakdown occurs as a result of field emission of electrons by the negative electrode under the influence of a sufficiently strong electrostatic field generated by the application of an operating voltage on a positive electrode. As described herein, vacuum breakdown may be reduced or eliminated by separating the positive electrode (or anode) from the negative electrode (such as the control grid) by a preselected grid-to-anode distance.

As used herein "gas breakdown" refers to a condition within a gas switch, in which an operating voltage applied on an anode of the gas switch exceeds a breakdown voltage of an ionizable gas separating the anode from a control grid of the gas switch. As described herein, gas breakdown may be reduced or eliminated by selecting an appropriate gas pressure, in combination with the selected grid-to-anode distance, within the gas switch.

Embodiments of the present disclosure relate to a gas switch that operates at high voltage, such as, for example, a voltage in the range of 50-1,000 kilovolts (kV). The gas switch includes an anode and a control grid disposed between the anode and the cathode and spaced apart from the anode by a preselected grid-to-anode distance. Specifically, the grid-to-anode distance is selected based upon a desired operating or breakdown voltage to prevent vacuum breakdown between the anode and the control grid. The gas switch is also filled with an ionizable gas, such as helium, and a gas pressure is preselected based upon a Paschen curve for the ionizable gas. In particular, the Paschen curve plots breakdown voltages of the ionizable gas as a function of grid-to-anode distance multiplied by gas pressure. The product of these values is referred to as a "pressure-distance product" or "PDP," and the PDP is used in conjunction with the selected grid-to-anode distance and operating voltage to identify a suitable gas pressure.

FIG. 1 is a cross-sectional view of an exemplary high voltage, cross-field, gas switch 100 (or "gas switch"). Gas switch 100 is generally cylindrical and includes a cylindrical gas-tight housing 102 that encloses and seals the various switch components described herein. A switch axis 104 extends through and is defined with respect to gas-tight housing 102. In the exemplary embodiment, gas-tight housing 102 includes an insulating material, such as a ceramic insulator. Further, as described below, a conductive ring 120 may be inserted and/or sealed between upper and lower portions of gas-tight housing 102 without affecting the gas-tightness and/or insulating properties of gas-tight housing 102.

For example, in some embodiments, gas-tight housing 102 comprises an upper cylindrical portion 170 and a lower cylindrical portion 172, where upper cylindrical portion 170 and lower cylindrical portion 172 are separated by and mechanically coupled through conductive ring 120. Thus, in at least some embodiments, gas-tight housing 102 is made up of upper cylindrical portion 170 and lower cylindrical portion 172 with conductive ring 120 sandwiched therebetween. In addition, in some embodiments, gas-tight housing 102 may include an upper metal ring 174 that is welded or otherwise electrically and mechanically coupled to an anode (as described below) and a lower metal ring 176 that is welded or otherwise electrically and mechanically coupled to a cathode (as described below). Further, in some embodiments, upper metal ring 174 may be surrounded by an upper mounting ring 178, and lower metal ring 176 may be surrounded by a lower mounting ring 180, each of which may facilitate a gas tight seal on gas-tight housing 102.

In the exemplary embodiment, gas switch 100 also includes an anode 106 and a cathode 108. Cathode 108 is axially separated (or spaced apart) from anode 106 and disposed in substantially parallel relation to anode 106. Cathode 108 includes an upper surface, such as a conduction surface 107, and a lower surface 109. As described herein, cathode 108 need not be completely planar. For example, in some embodiments, cathode 108 includes an undulating or corrugated conduction surface 107. In other embodiments, however, conduction surface 107 is a smooth, planar, surface. Similarly, in the exemplary embodiment, anode 106 includes at least one planar and/or substantially planar surface; however, in other embodiments, anode 106 may include one or more non-planar surfaces as well. Further, some embodiments of gas switch 100 substitutes a concentrically arranged anode-cathode pair for the planar anode and cathode depicted at FIG. 1. In some embodiments, cathode 108 may include any suitable material composition, such as, for example, and without limitation, any of i) gallium, ii) an alloy of gallium, iii) indium, iv) tin, v) aluminum, vi) tungsten, vii) molybdenum, and vii) tantalum.

A keep-alive grid 110 ("KA grid" or "first grid") is positioned between cathode 108 and anode 106 and defines a grid-to-cathode gap 112, which may be filled with an ionizable gas having a low atomic mass, such as helium gas, hydrogen gas, or mixtures of hydrogen and helium, such as to a preselected gas pressure in the range of 0.01-1.0 torr (as described below). For example, grid-to-cathode gap 112 may be filled from a gas storage reservoir, such as a helium storage reservoir (not shown). In various embodiments, there is only one interior gas volume within gas-tight housing 102, such that gas in grid-to-cathode gap 112 is in full communication with gas in a grid-to-anode gap 116 (described below). Specifically, the entire interior volume of gas-tight housing 102 may be filled with an ionizable gas to the preselected gas pressure.

Further, in the exemplary embodiment, KA grid 110 is a substantially planar, electrically conductive, perforated structure. Specifically, KA grid 110 includes a plurality of perforations, apertures, or holes, sized to permit the flow of ionized gas (e.g., plasma) and electrons therethrough.

A control grid 114 (or "second grid") is also included in gas switch 100. Specifically, control grid 114 is positioned between KA grid 110 and anode 106 and defines grid-to-anode gap 116 (or "high voltage gap"). As shown, grid-to-anode gap 116 includes a preselected gap length or "grid-to-anode distance" 190, which may be selected (as described herein) based upon a desired operating or breakdown voltage of gas switch 100. In particular, a preselected grid-to-anode distance 190 may be selected to prevent vacuum breakdown between control grid 114 and anode 106 at a particular operating voltage while gas switch 100 is in an open state. In various embodiments, preselected grid-to-anode distance 190 is in the range of 2-15 centimeters (cm). In addition, in at least some embodiments, preselected grid-to-anode distance 190 is in the range of 3-10 cm.

Like KA grid 110, control grid 114 is a substantially planar, electrically conductive, perforated structure. Specifically, control grid 114 includes a substantially planar central region 192 that includes a plurality of perforations, apertures, or holes, sized to permit the flow of ionized gas (e.g., plasma) and electrons therethrough.

Further, in at least some embodiments, control grid 114 includes a contoured or shaped perimeter 194. For example, perimeter 194 may substantially follow or conform to a shape of anode 106 (e.g., a perimeter of anode 106). The shape of perimeter 194 is chosen so as to obstruct the transport of material that can be sputtered from the surface of the control grid during switch opening from depositing on the insulator and degrading insulator performance. The shape is further selected to maximize a diameter and/or surface area of central region 192, such as, for example, to maximize electrical current flow within gas switch 100.

A wire lead 118 extends through gas-tight housing 102 and is electrically and mechanically connected between KA grid 110 and a bias voltage supply 150 (or "power supply") arranged to provide a bias voltage to KA grid 110. Similarly, conductive ring 120 is mounted within gas-tight housing 102 (e.g., as described above) and is electrically and mechanically connected between control grid 114 and bias voltage supply 150, such that conductive ring 120 is arranged to provide a bias voltage to control grid 114.

In operation, an operating voltage in the range of 50-1,000 kilovolts (kV) is applied on anode 106. In the presence of the operating voltage, gas switch 100 is capable of "opening" and "closing" to selectively permit the flow of electrical current between anode 106 and cathode 108. More particularly, in an "open" state, electrical current is prevented from flowing between anode 106 and cathode 108, and in a "closed" state, electrical current flows from anode 106 to cathode 108. To open gas switch 100, a reverse bias voltage, such as a reverse bias voltage in the range of −100 to −3,000 volts, is applied on control grid 114. Similarly, to close gas switch 100, a forward bias voltage, such as a forward bias voltage in the range of +100 to +3,000 volts, is applied on control grid 114. In other embodiments, however, any forward bias voltage above an electron temperature of several volts may be sufficient to close gas switch 100.

When gas switch 100 is closed, the ionizable gas contained within the switch 100 ionizes to form a conducting plasma between anode 106 and cathode 108, where the conducting plasma facilitates conduction of electrical current between anode 106 and cathode 108. Moreover, in a closed state, gas switch 100 may operate in a variety of modes, such as, for example, a low forward voltage drop mode. However, the physical processes related to formation of the conducting plasma as well as the low forward voltage drop mode are not central to an understanding of the present disclosure; notwithstanding, additional detail may be obtained with reference to U.S. patent application Ser. No. 15/860,225, filed Jan. 2, 2018, and entitled LOW VOLTAGE DROP, CROSS-FIELD, GAS SWITCH AND METHOD OF OPERATION, which is hereby incorporated by reference in its entirety.

Conversely, in an open state, gas switch 100 must maintain, or "stand-off," all of the operating voltage on anode 106. As used herein, a "stand-off" voltage is a maximum voltage that can be applied on anode 106 before the dielectric barrier between anode 106 and control grid 114 breaks down, and gas switch 100 may be referred to as being able to "stand-off" any operating voltage that is less than the stand-off or breakdown voltage. In other words, the term "stand-off voltage" is synonymous with the term "breakdown voltage" and refers to a maximum voltage that can be maintained on anode 106 while gas switch 100 is open (i.e., without causing electrical arc-over from anode 106 to cathode 108). In addition, when gas switch 100 is opened, any conducting plasma formed between anode 106 and cathode 108 is terminated (or prevented from forming), such that electrical current is prevented from flowing between anode 106 and cathode 108.

Gas switch 100 is therefore generally capable of standing-off any voltage on anode 106 that does not result in dielectric breakdown between anode 106 and control grid 114. More particularly, gas switch 100 is capable of standing off operating voltages that do not result in vacuum breakdown and/or gas breakdown between anode 106 and control grid 114 (as described above).

To prevent vacuum breakdown, grid-to-anode distance 190 may be selected (or "preselected") as a function of a desired operating voltage. Specifically, a suitable grid-to-anode distance 190 is selected to prevent vacuum breakdown between anode 106 and control grid 114 at the desired operating voltage. More particularly, larger operating voltages require larger grid-to-anode distances 190 for the prevention of vacuum breakdown (e.g., because larger voltages can arc over larger distances). As such, grid-to-anode distance 190 may be increased and/or decreased to increase and/or decrease the stand-off or breakdown voltage of gas switch 100, respectively.

Similarly, gas breakdown may be prevented by selecting (or "preselecting") an appropriate gas pressure for the ionizable gas contained within gas switch 100. Specifically, a suitable gas pressure is selected to prevent gas breakdown between anode 106 and control grid 114 at the desired operating voltage. In addition, the selected gas pressure may be decreased to stand-off higher voltages and increased to stand-off lower voltages. Physically, lower gas pressures permit gas switch 100 to stand-off higher operating voltages, because the conduction medium (i.e., the ionizable gas) is less dense at lower gas pressures.

Accordingly, the breakdown or stand-off voltage of gas switch 100 is a function of two parameters gas pressure and grid-to-anode distance 190. Specifically, breakdown voltages are a function of gas pressure ($P_g$) multiplied by grid-to-anode distance 190 ($d_{GA}$). The product of this multiplication ($P_g \times d_{GA}$) may be referred to as a "pressure-distance product" or "PDP." Breakdown voltages of gas switch 100 may be plotted as a function of PDP on a so-called "Paschen curve."

Figure 2:
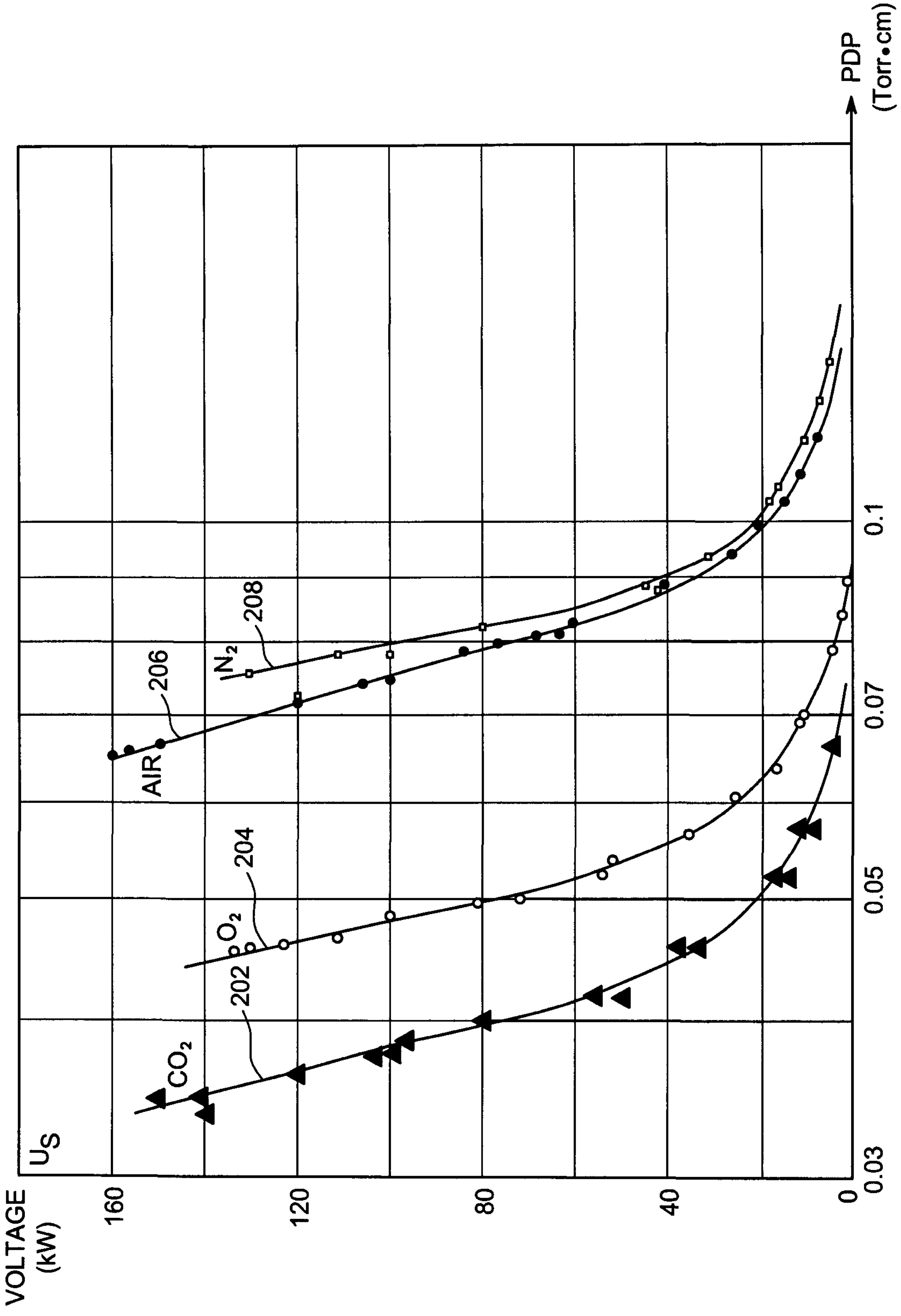
FIG. 2 illustrates a plurality of exemplary Paschen curves for a plurality of ionizable gasses, in which each Paschen curve terminates at 160 kilovolts.

FIG. 2 illustrates a plurality of known Paschen curves for a plurality of ionizable gasses. In particular, a first Paschen curve 202 is shown for carbon dioxide gas ($CO_2$), a second Paschen curve 204 is shown for oxygen gas ($O_2$), a third Paschen curve 206 is shown for air, and a fourth Paschen curve 208 is shown for nitrogen gas ($N_2$). A Paschen curve for helium is not shown at FIG. 2; however, as described in detail below with reference to FIG. 3, the Paschen curve for helium is similar to the Paschen curves for carbon dioxide, oxygen, air, and nitrogen, in that the curve for helium increases monotonically for decreasing values of PDP below approximately 160 kV.

As shown, a range of breakdown voltages are plotted on the y-axis, and a range of pressure-distance products are plotted on the x-axis. Regions to the left of each Paschen curve 202-208 are associated with nominal operating voltages (or non-breakdown voltages), and regions to the right of each Paschen curve 202-208 are associated with breakdown voltages. Thus, any combination of PDP and operating voltage to the left of (or "under") a Paschen curve 202-208 may be selected to prevent dielectric breakdown (e.g., vacuum and gas breakdown) within gas switch 100.

The Paschen curves depicted at FIG. 2 do not extend beyond 160 kV. Broadly, this is because the shape of each curve 202-208 in the range 0-160 kV (e.g., monotonically increasing as PDP decreases) suggests that PDP values only decrease as breakdown voltage increases beyond 160 kV, and on that assumption, previous efforts to develop a high voltage gas switch have failed. Specifically, previous efforts have failed, because higher breakdown voltages always require a larger grid-to-anode gap 190 ($d_{GA}$), which means, based on the PDP equation above (i.e., PDP=$P_g \times d_{GA}$), that gas pressure ($P_g$) must decrease to accommodate higher stand-off voltages. However, a pressure floor occurs near breakdown voltages in the range of 160 kV, beyond which the gas pressure within gas switch 100 is simply insufficient to close switch 100, even when desired. As a result, Paschen curves have not conventionally been plotted for ionizable gasses (including helium) at operating voltages greater than approximately 160 kV (e.g., because it was thought that gas pressures necessary to satisfy the PDP equation would be unfeasibly low at voltages greater than 160 kV).

Figure 3:
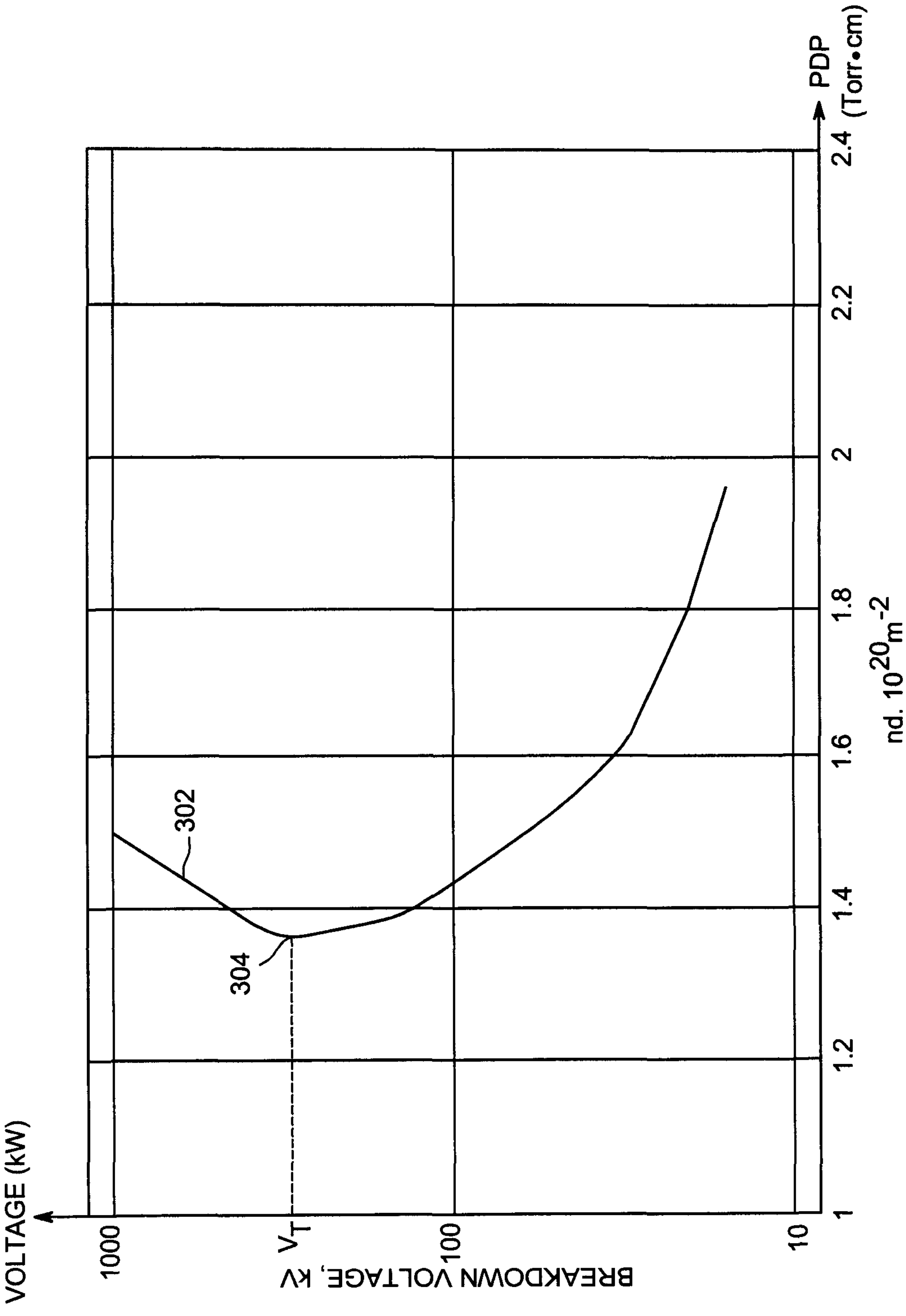
FIG. 3 illustrates an exemplary Paschen curve for helium gas, in which the Paschen curve extends to 1,000 kilovolts.

However, as shown with reference now to FIG. 3, the inventors have determined that the shape of the Paschen curve 302 for helium only increases monotonically to a threshold breakdown voltage 304, $V_T$, of approximately 300 kV. Beyond threshold breakdown voltage 304, the Paschen curve turns to the right and PDP values increase in conjunction with increasing breakdown voltages. In other words, the inventors have determined that PDP values can, in fact, be selected for operation of gas switch 100 at operating voltages exceeding 160 kV, because PDP values unexpectedly increase above approximately 300 kV.

Specifically, Paschen curve 302 indicates the existence of PDP values large enough for reliable implementation of gas switch 100 over an expanded range of operating voltages, such as, for example, over a range of 50-1,000 kV. Although Paschen curves for other ionizable gasses (e.g., hydrogen) are not shown, the inventors believe that at least some of these other Paschen curves (e.g., curves 202-208, the curve for hydrogen, etc.) may behave in a manner similar to Paschen curve 302 for helium.

Figure 4:
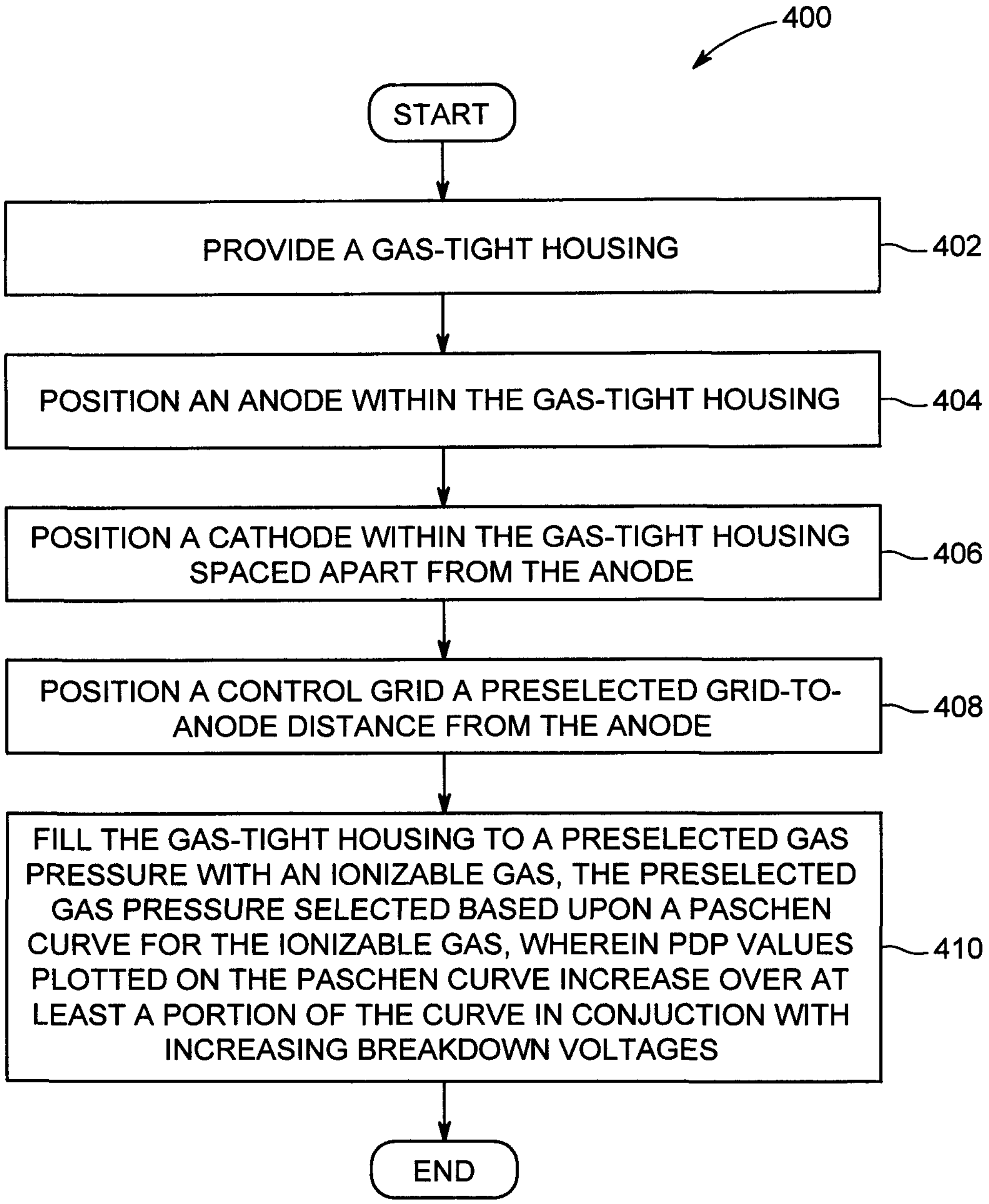
FIG. 4 is a flowchart illustrating an exemplary process of manufacturing the gas switch shown at FIG. 1.

Accordingly, FIG. 4 is a flowchart illustrating an exemplary process 400 of manufacturing gas switch 100 (shown at FIG. 1). In the exemplary embodiment, gas-tight housing 102 is provided (step 402), anode 106 is positioned within gas-tight housing (step 404), and cathode 108 is positioned within gas-tight housing 102 (step 406). In addition, control grid 114 is positioned within gas-tight housing 102. Specifically, control grid 114 is positioned by preselected grid-to-anode distance 190 from anode 106 (step 408). As described herein, preselected grid-to-anode distance 190 is selected based upon a desired operating voltage, such that gas switch 100 is capable of standing-off the desired operating voltage in an open state. The grid-to-anode distance is set sufficiently large so as to avoid vacuum breakdown.

Once the desired operating voltage and grid-to-anode distance 190 are selected (or preselected), gas-tight housing 102 is filled to a preselected gas pressure with an ionizable gas, such as helium (step 410). The gas pressure is selected based upon Paschen curve 302 (or an expanded Paschen curve for another ionizable gas). More particularly, the gas pressure is selected by identifying a desired operating and/or breakdown voltage on Paschen curve 302. The identified voltage corresponds to a PDP value, and the gas pressure may be calculated from the PDP value and preselected grid-to-anode distance 190 identified at step 408. Specifically, the PDP equation described above (i.e., PDP=$P_g \times d_{GA}$) may be rearranged as follows to give a requisite gas pressure at a selected breakdown voltage and grid-to-anode distance 190: $P_g$=PDP/$d_{GA}$. To summarize, and in general, after setting grid-to-anode distance 190 large enough to avoid vacuum breakdown, and the preselected gas pressure low enough to avoid gas breakdown, gas-tight housing 102 is filled to the preselected gas pressure with the selected ionizable gas, ensuring, however, that there a sufficient quantity of ionizable gas is present to allow gas switch 100 to close, as described above. In other words, it is necessary to ensure that the preselected gas pressure is not so low that an insufficient quantity of ionizable gas is utilized.

Embodiments of the present disclosure thus relate to a gas switch capable of operating at high voltage, such as, for example, a voltage in the range of 50-1,000 kilovolts (kV). The gas switch includes an anode, a cathode spaced apart from the anode, and a control grid disposed between the anode and the cathode and spaced apart from the anode by a preselected grid-to-anode distance. Specifically, the grid-to-anode distance is selected based upon a desired operating and/or breakdown voltage to prevent vacuum breakdown between the anode and the control grid. The gas switch is also filled with an ionizable gas, such as helium, and a gas pressure is preselected based upon a Paschen curve for the ionizable gas. In particular, the Paschen curve plots breakdown voltages of the ionizable gas as a function of grid-to-anode distance multiplied by gas pressure. The product of these values is referred to as a "pressure-distance product" or "PDP," and the PDP is used in conjunction with the selected grid-to-anode distance and operating voltage to identify a suitable gas pressure.

Exemplary technical effects of the gas switch described herein include, for example: (a) operation at high voltages, such as voltages ranging from 50 kV to 1,000 kV; (b) selection of grid-to-anode distances based upon desired operating voltage; and (c) selection of gas pressures that are not so low as to be unfeasible to implement.

Exemplary embodiments of a gas switch and related components are described above in detail. The system is not limited to the specific embodiments described herein, but rather, components of systems and/or steps of the methods may be utilized independently and separately from other components and/or steps described herein. For example, the configuration of components described herein may also be used in combination with other processes, and is not limited to practice with the systems and related methods as described herein. Rather, the exemplary embodiment can be implemented and utilized in connection with many applications where a gas switch is desired.

Although specific features of various embodiments of the present disclosure may be shown in some drawings and not in others, this is for convenience only. In accordance with the principles of the present disclosure, any feature of a drawing may be referenced and/or claimed in combination with any feature of any other drawing.

This written description uses examples to disclose the embodiments of the present disclosure, including the best mode, and also to enable any person skilled in the art to practice the disclosure, including making and using any devices or systems and performing any incorporated methods. The patentable scope of the embodiments described herein is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A high voltage gas switch comprising:

a gas-tight housing containing an ionizable gas at a gas pressure selected based upon a Paschen curve for the ionizable gas, wherein the Paschen curve plots breakdown voltages of the ionizable gas as a function of gas pressure multiplied by grid-to-anode distance, wherein values of gas pressure multiplied by grid-to-anode distance increase over at least a portion of the Paschen curve in conjunction with increasing breakdown voltages, and wherein values of gas pressure multiplied by grid-to-anode distance increase over a portion of the Paschen curve beyond a threshold breakdown voltage;

an anode disposed within said gas-tight housing;

a cathode disposed within said gas-tight housing; and a control grid positioned between said anode and said cathode, said control grid spaced apart from said anode by a grid-to-anode distance selected based upon a desired operating voltage.

2. The gas switch of claim 1, wherein the threshold breakdown voltage is 300 kilovolts (kV).

3. The gas switch of claim 1, wherein the grid-to-anode distance is in the range of 2-15 centimeters (cm).

4. The gas switch of claim 1, wherein said gas-tight housing contains helium.

5. The gas switch of claim 1, wherein the grid-to-anode distance is selected to prevent vacuum breakdown between said anode and said control grid at the desired operating voltage.

6. The gas switch of claim 1, wherein the gas pressure is selected to prevent gas breakdown between said anode and said control grid at the desired operating voltage.

7. The gas switch of claim 1, wherein said control grid comprises a perforated electrically conductive surface.

8. The gas switch of claim 1, wherein said cathode comprises at least one of i) gallium, ii) an alloy of gallium, iii) indium, iv) tin, v) aluminum, tungsten, molybdenum, and tantalum.

9. The gas switch of claim 1, wherein said gas switch is operable in the range of 50-1,000 kilovolts (kV).

10. A high voltage, cross-field, gas switch containing an ionizable gas at a gas pressure selected based upon:

a distance between electrodes of said gas switch; and a Paschen curve for the ionizable gas, wherein the Paschen curve plots breakdown voltages of the ionizable gas as a function distance between electrodes multiplied by gas pressure, wherein values of distance between electrodes multiplied by gas pressure increase over a portion of the Paschen curve in conjunction with increasing breakdown voltages, and wherein values of gas pressure multiplied by distance between electrodes increase over a portion of the Paschen curve beyond a threshold breakdown voltage.

11. The gas switch of claim 10, wherein the distance between electrodes is a distance between an anode and a control grid spaced apart from the anode.

12. The gas switch of claim 10, wherein the threshold breakdown voltage is 300 kilovolts (kV).

13. The gas switch of claim 10, wherein the distance between electrodes is in the range of 2-15 centimeters (cm).

14. The gas switch of claim 10, wherein the ionizable gas is helium.

15. The gas switch of claim 10, wherein the distance between electrodes is selected to prevent vacuum breakdown between a first electrode and a second electrode at the desired operating voltage.

16. The gas switch of claim 10, wherein the preselected gas pressure is selected to prevent gas breakdown between a first electrode and a second electrode at the desired operating voltage.

17. The gas switch of claim 10, wherein said gas switch is operable in the range of 50-1,000 kilovolts (kV).

18. A high voltage gas switch comprising:

a gas-tight housing containing an ionizable gas at a gas pressure in the range of 0.01-1.0 torr, the gas pressure selected based upon a Paschen curve for the ionizable gas, wherein the Paschen curve plots breakdown voltages of the ionizable gas as a function of gas pressure multiplied by a grid-to-anode distance, wherein values of gas pressure multiplied by grid-to-anode distance increase over at least a portion of the Paschen curve in conjunction with increasing breakdown voltages, and wherein values of gas pressure multiplied by grid-to-anode distance increase over a portion of the Paschen curve beyond a threshold breakdown voltage;

an anode disposed within said gas-tight housing;

a cathode disposed within said gas-tight housing; and a control grid positioned between said anode and said cathode, said control grid spaced apart from said anode by the grid-to-anode distance in the range of 2-15 centimeters (cm), the grid-to-anode distance selected based upon a desired operating voltage.

* * * * *